United States Patent
Nakao (10) Patent No.: US 9,848,496 B2
(45) Date of Patent: Dec. 19, 2017

(54) ELECTRONIC COMPONENT MODULE AND MANUFACTURING METHOD THEREOF

(71) Applicant: SAE MAGNETICS (H.K.) LTD., Hong Kong (CN)

(72) Inventor: Akio Nakao, Hong Kong (CN)

(73) Assignee: SAE MAGNETICS (H.K.) LTD., Hong Kong (CN)

(*) Notice: Subject to any disclaimer, the term of this patent is extended or adjusted under 35 U.S.C. 154(b) by 0 days.

(21) Appl. No.: 14/978,709

(22) Filed: Dec. 22, 2015

(65) Prior Publication Data
US 2016/0278202 A1   Sep. 22, 2016

(30) Foreign Application Priority Data

Mar. 18, 2015 (CN) .................... 2015 2 0154542 U (51) Int. Cl.
| | |
|---|---|
| *H05K 1/14* | (2006.01) |
| *H05K 3/28* | (2006.01) |
| *H05K 3/00* | (2006.01) |
| *H05K 1/02* | (2006.01) |

(52) U.S. Cl.
CPC .......... *H05K 3/284* (2013.01); *H05K 3/0097* (2013.01); *H05K 1/0218* (2013.01); *H05K 2201/0317* (2013.01); *H05K 2201/0715* (2013.01); *H05K 2201/09145* (2013.01); *H05K 2201/09845* (2013.01)

(58) Field of Classification Search
CPC .... H05K 3/284; H05K 1/0218; H05K 3/0097; H05K 2201/0715; H05K 2201/0317; H05K 2201/09145; H05K 2201/09845

USPC .............. 361/736, 760, 801, 807, 809, 747; 174/260
See application file for complete search history.

(56) References Cited

U.S. PATENT DOCUMENTS

| | | | | |
|---|---|---|---|---|
| 5,838,551 | A * | 11/1998 | Chan ..................... | H01L 23/552 174/372 |
| 6,097,609 | A * | 8/2000 | Kabadi ................ | H05K 7/1061 174/253 |
| 6,219,238 | B1 * | 4/2001 | Andros ............... | H01L 23/4093 24/625 |
| 7,180,012 | B2 | 2/2007 | Tsuneoka et al. | |
| 7,446,262 | B2 | 11/2008 | Ogawa et al. | |
| 8,735,736 | B2 * | 5/2014 | Kasajima .............. | H01L 23/552 174/260 |

(Continued)

*Primary Examiner* — Hung S Bui
(74) *Attorney, Agent, or Firm* — Nixon & Vanderhye PC (57) ABSTRACT

An electronic component module includes a substrate; at least one electronic component mounted on an electronic component mounting surface of the substrate; an insulating body covering the electronic component on the electronic component mounting surface of the substrate; and a metal film formed by sputtering, the metal film covering at least one exterior surface of the insulating body and at least one side surface of the substrate. The substrate has a recess portion formed on a periphery of the surface of the substrate that is opposite to the electronic component mounting surface, and the recess portion has a top surface parallel to the electronic component mounting surface and a side surface perpendicular to the top surface, and the metal film is extended to cover the top surface of the recess portion, without covering the side surface thereof. It obtains improved electromagnetic wave shielding effect and improved manufacturing efficiency.

14 Claims, 8 Drawing Sheets

(56) References Cited

U.S. PATENT DOCUMENTS

| | | | |
|---|---|---|---|
| 2005/0013082 A1* | 1/2005 | Kawamoto | H01L 24/16 |
| | | | 361/118 |
| 2009/0002967 A1 | 1/2009 | Asami | |
| 2011/0298111 A1* | 12/2011 | Kim | H01L 21/561 |
| | | | 257/660 |
| 2015/0035127 A1* | 2/2015 | Yang | H01L 23/60 |
| | | | 257/659 |

* cited by examiner

ELECTRONIC COMPONENT MODULE AND MANUFACTURING METHOD THEREOF

RELATED APPLICATIONS

This application claims the benefit of priority to Chinese Patent Application No. 201520154542.4 filed in Mar. 18, 2015, which is hereby incorporated by reference in its entirety.

FIELD OF THE INVENTION

The present invention relates to electronic component modules, and in particular, to electronic component modules having electromagnetic wave shields.

BACKGROUND OF THE INVENTION

In order to take measures against electromagnetic waves such as prevention of electromagnetic wave leakage or electromagnetic wave penetration with respect to electronic components, electronic components are covered with electromagnetic wave shields in their peripheries. For example, JP 2003-142626 A (Patent Document 1) discloses a technique of covering the periphery of a semiconductor chip mounted on a substrate with a metal cap provided on the substrate. JP 2006-332255 A (Patent Document 2) discloses a technique of covering the periphery of a semiconductor chip mounted on a substrate and a part of the substrate up to a predetermined depth with a metal film by plating. Further, JP 2002-208651 A (Patent Document 3) discloses a technique of covering the periphery of a semiconductor chip mounted on a substrate and the periphery of the substrate, that is, side surfaces thereof, with a metal cap.

[Patent Document 1] JP 2003-142626 A
[Patent Document 2] JP 2006-332255 A
[Patent Document 3] JP 2002-208651 A However, the above-described techniques of covering electronic components with electromagnetic wave shields have the following disadvantages. In the techniques disclosed in Patent Documents 1 and 2, although the periphery of a semiconductor chip on the substrate is covered with an electromagnetic wave shield, all or part of the side surfaces of the substrate are not covered with the electromagnetic wave shield. This causes a problem of low electromagnetic wave shielding effect with respect to an electromagnetic component module.

Further, in the technique disclosed in Patent Document 3, although a substrate is covered with an electromagnetic wave shield up to the side surfaces, the manufacturing efficiency of electronic component modules is lowered. This means that in the technique of Patent Document 3, after each electronic component module is manufactured, it is necessary to dispose a metal cap for covering the top surface and the side surfaces thereof. As such, a plurality of numbers of electronic component modules cannot be manufactured at once, causing a problem that the manufacturing efficiency is lowered.

Thus it is desired to provide an improved electronic component module to overcome the drawbacks mentioned above.

SUMMARY OF THE INVENTION

One objective of the present invention is to provide an electronic component module capable of solving the above-described problems such as low electromagnetic wave shielding effect and low manufacturing efficiency.

Another objective of the present invention is to provide a manufacturing method of an electronic component module capable of solving the above-described problems such as low electromagnetic wave shielding effect and low manufacturing efficiency.

To achieve above objective, an electronic component module of the present invention includes a substrate; at least one electronic component mounted on an electronic component mounting surface of the substrate; an insulating body that covers the electronic component on the electronic component mounting surface of the substrate; and a metal film formed by sputtering, the metal film covering at least one exterior surface of the insulating body and at least one side surface of the substrate. The substrate has a recess portion formed on a periphery of the surface of the substrate that is opposite to the electronic component mounting surface, and the recess portion has a top surface parallel to the electronic component mounting surface and a side surface abutting to and perpendicular to the top surface, and the metal film is extended to cover the top surface of the recess portion, without covering the side surface of the recess portion.

As a preferable embodiment, the metal film covers all exterior surfaces of the insulating body and all side surfaces of the substrate.

As another preferable embodiment, the recess portion is formed around the peripheries of the surface of the substrate that is opposite to the electronic component mounting surface.

Preferably, the recess portion is formed in a stepped shape.

More preferably, the recess portion formed in the stepped shape has a height in a thickness direction of the substrate is in a range from 5 μm to 50 μm, and a depth is 50 μm or more.

Accordingly, manufacturing method of electronic component module includes: mounting an electronic component on an electronic component mounting surface of a substrate; covering the electronic component with an insulating body on the electronic component mounting surface of the substrate; forming a recess portion on a periphery of the surface of the substrate that is opposite to the electronic component mounting surface, the recess portion having a top surface parallel to the electronic component mounting surface and a side surface abutting to and perpendicular to the top surface; in a state where the substrate is disposed on a predetermined sheet member, cutting into a piece of electronic component module or a set of electronic component modules while remaining at least a part of the sheet member; and covering an exterior surface of the insulating body, a side surface of the substrate and the top surface of the recess portion with a metal film by sputtering, with the side surface of the recess portion being exposed.

In comparison with the prior art, as the electronic component module is configured such that a metal film covers the exterior surface of the insulating body, the side surface of the substrate, and the top surface of the recess portion formed in a periphery of the surface of the substrate that is opposite to the electronic component mounting surface, from which electromagnetic waves are easily leaked or which are easily affected by electromagnetic waves, thereby the electromagnetic wave shielding effect can be improved. Further, in the manufacturing process, even if the metal film is formed in a state where a surface opposite to the electronic component mounting surface of the substrate constituting the electronic component module is disposed on a predetermined sheet member, as the recess portion is formed in the periphery of the surface disposed on the sheet member, it is possible to prevent the metal film from being formed in the recess portion. Accordingly, the metal film, formed on at least one side surface of the electronic component module, will never be formed to be linked with the sheet member. As a result, the sheet member can easily be torn off from the electronic component module, whereby the manufacturing efficiency can be improved.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIGS. 8a~9c are illustrations showing states of respective steps of manufacturing the electronic component modules according to the present embodiment.

DETAILED DESCRIPTION OF ILLUSTRATED EMBODIMENTS

Various preferred embodiments of the invention will now be described with reference to the figures, wherein like reference numerals designate similar parts throughout the various views. As indicated above, the invention is directed to an electronic component module which can improve electromagnetic wave shielding effect.

Figure 1:
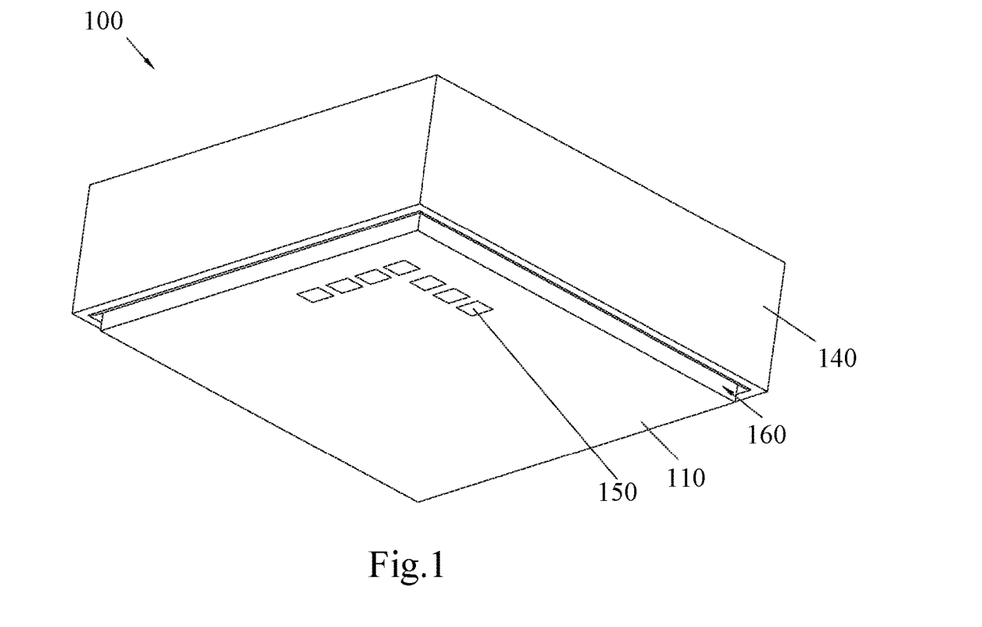
FIG. 1 is a perspective view of an electronic component module according to a first embodiment of the present invention.
Figure 2:
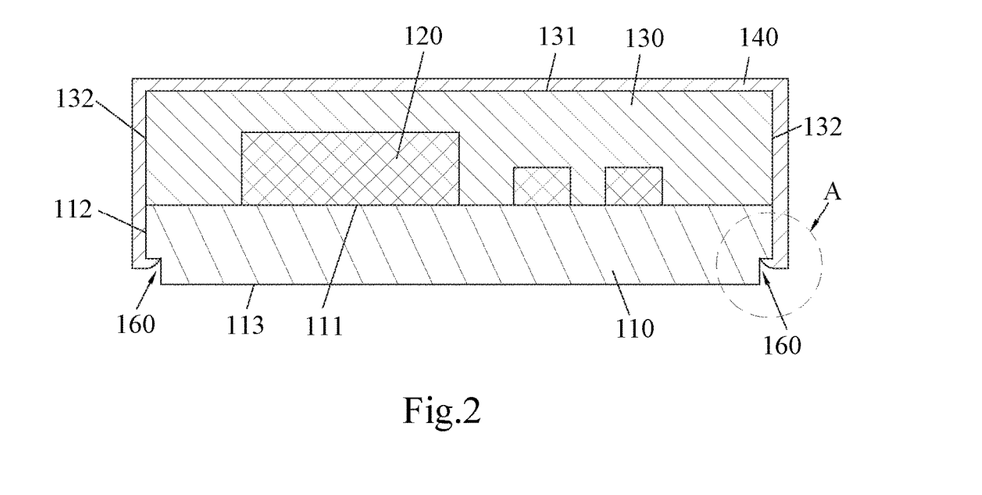
FIG. 2 is a cross-sectional view of the electronic component module of FIG. 1.
Figure 3:
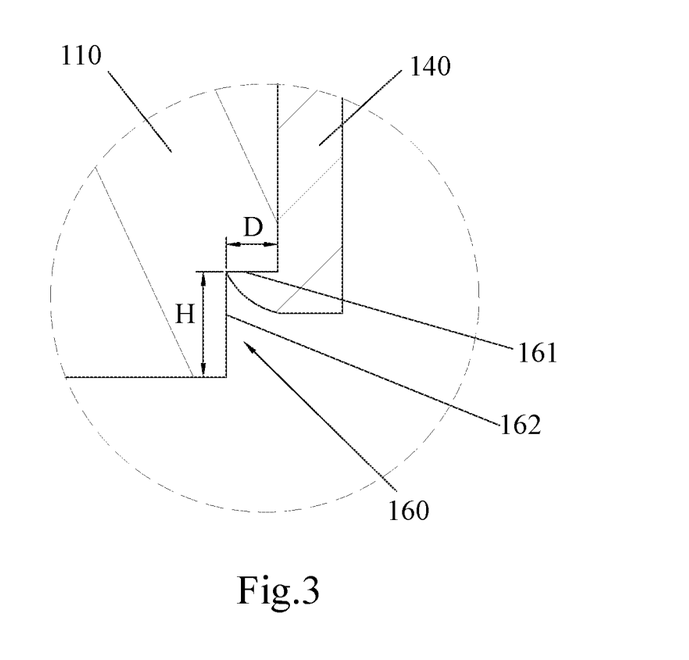
FIG. 3 is a partial enlarged view of the portion A in FIG. 2.

FIGS. 1~3 show an electronic component module according to a first embodiment of the present invention. FIG. 1 shows a perspective view of an electronic component module according to the present invention. FIG. 2 is a cross-sectional view of the electronic component module 100 of FIG. 1. FIG. 3 is a partial enlarged view of the portion A in FIG. 2. As illustrated, the electronic component module 100 includes a substrate 110 having an electronic component mounting surface 111 for mounting electronic components 120 and a connection terminal formation surface 113 for forming connection terminals 150 opposite each other, electronic components 120 mounted on the electronic component mounting surface 111, and an insulating body 130 covering the electronic components 120. Further the electronic component module 100 includes a metal film 140 covering the outer surfaces of the insulating body 130 and the substrate 110, which is beneficial to improve electromagnetic wave shielding effect and will be described in details thereinafter.

In this embodiment, the metal film 140 is covered on all exterior exposed surfaces of the insulating body 130, including a top surface 131 and a side surface 132 abutting to the top surface 132, and the metal film 140 is also covered on a side surface 112 of the substrate 110. In this embodiment, the side surface 132 of the insulating body 130 includes two pairs of opposite surfaces; the side surface 112 of the substrate 110 also includes two pairs of opposite surfaces.

It should be noted that, due to the bottom surface of the insulating body 130 is matched and attached to the electronic component mounting surface 111 of the substrate 110, thus the two surfaces are not exposed and covered with the metal film 140. It's unnecessary to cover the connection terminal formation surface 113 of the substrate 110 with the metal film 140, as the connection terminals 150 are required to be exposed to connect with a PCB (not shown).

As shown in FIG. 2, the substrate 110 has a recess portion 160 formed around a periphery of the connection terminal formation surface 113 of the substrate 110. Preferably, the recess portion 160 is formed in a stepped shape. That is, the lowest portion of the substrate 110 close to the connection terminal formation surface 113 is narrower than the upper portion of the substrate 110 as illustrated. Specifically, the recess portion 160 has a top surface 161 parallel to the electronic component mounting surface 111 of the substrate 110 and a side surface 162 abutting to and perpendicular to the top surface 161, as best shown in FIG. 3. Specifically, the metal film 140 is extended to cover the top surface 161 of the recess portion 160, but without covering the side surface 162 of the recess portion 160 preferably. Thus the portion of the metal film 140 covering the top surface 161 of the recess portion 160 is shaped in that way as shown in FIG. 3.

Because the metal film 140 is not formed on the side surface 162 of the recess portion 160 and the connection terminal formation surface 113 of the substrate 110, that is the metal film 160 will not contact with the side surface 162 of the recess portion 160 and the connection terminal formation surface 113 of the substrate 110, therefore in the manufacturing process, even if the metal film 140 is formed in a state where a surface opposite to the electronic component mounting surface 111 of the substrate 110 constituting the electronic component module 100 is disposed on a predetermined sheet member, as the recess portion 160 is formed in the periphery of the surface disposed on the sheet member, it is possible to prevent the metal film 140 from being formed in the recess portion 160. Accordingly, the metal film 140, formed on at least one side surface of the electronic component module, will never be formed to be linked with the sheet member. As a result, the sheet member can easily be torn off from the electronic component module 100, whereby the manufacturing efficiency can be improved.

In this embodiment as shown in FIG. 3, the recess portion 160 has a height H in a thickness direction of the substrate is in a range from 5 μm to 50 μm, preferably from 10 μm to 25 μm, and a depth D is 50 μm or more, preferably from 30 μm to 80 μm for example.

Specifically, the metal film 140 in the invention is formed by sputtering. Preferably, the metal film 140 is made up of an underlayer (not shown), a copper layer (not shown) and an oxidation resistant layer (not shown). The underlayer is made up of Titanium or Chromium, the oxidation resistant layer is made up of Stainless or Nickel for example.

In the present invention, since an electromagnetic wave shield is formed by the metal film 140 on the entire external surfaces (except for the connecting terminal formation surface 113 of the substrate 110, and the side surface 162 of the recess portion 160) of each of the electronic component modules 100, so that the magnetism leakage prevention effect and the magnetism shielding effect can be improved.

Figure 4:
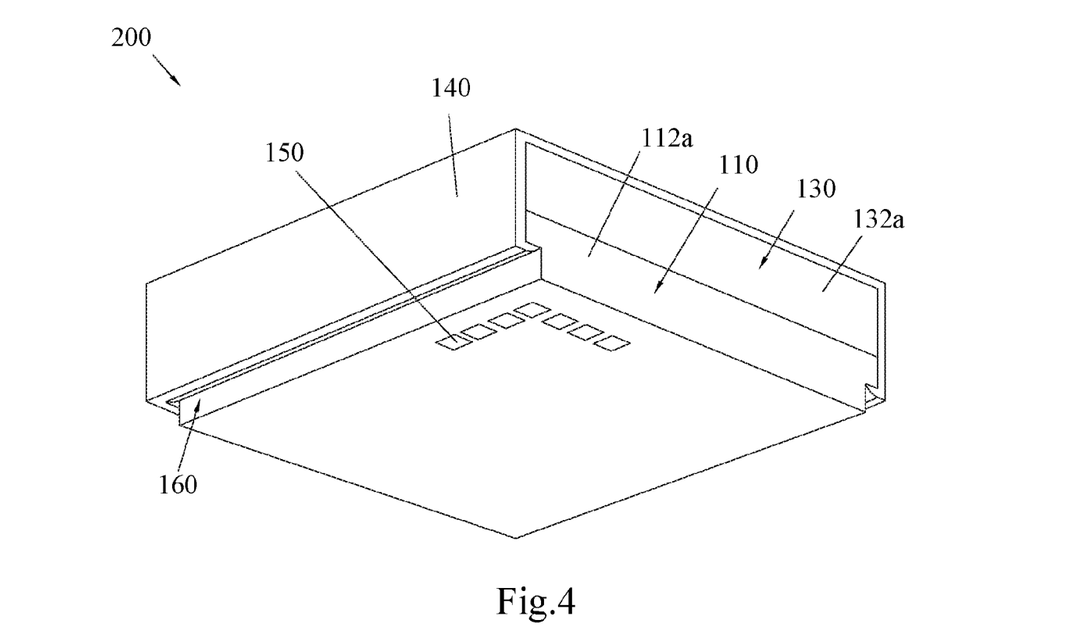
FIG. 4 is a perspective view of an electronic component module according to a second embodiment of the present invention.
Figure 5:
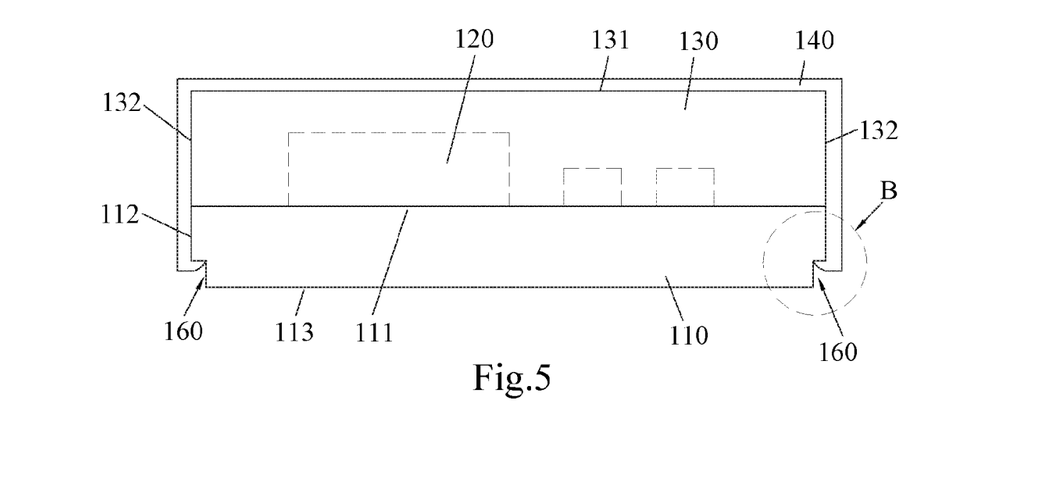
FIG. 5 is a side view of the electronic component module of FIG. 4.
Figure 6:
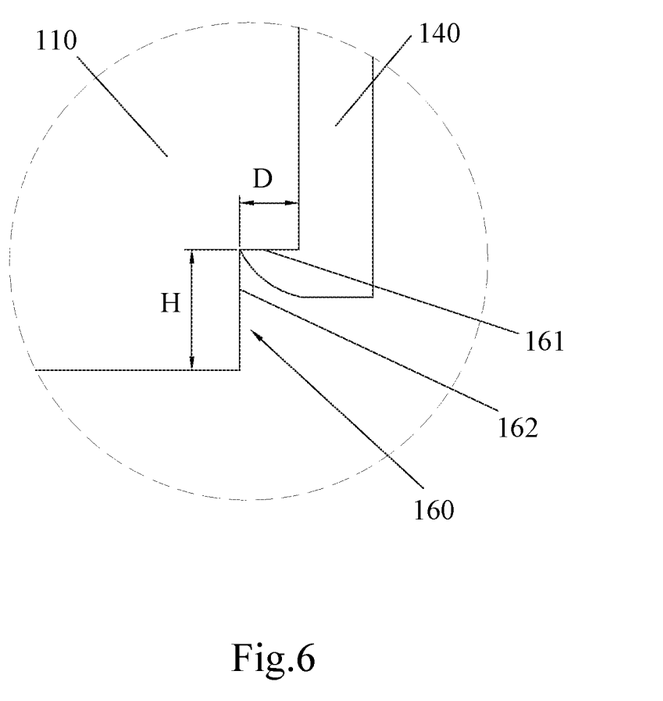
FIG. 6 is a partial enlarged view of the portion B in FIG. 5.

FIGS. 4~6 show an electronic component module according to a second embodiment of the present invention. FIG. 4 is a perspective view of an electronic component module; FIG. 5 is a side view of the electronic component module of FIG. 4; and FIG. 6 is a partial enlarged view of the portion B in FIG. 5. It should be noted that an electronic component module 200 of the present embodiment has an almost similar configuration to that of the electronic component module 100 in the first embodiment, except that the electronic component module 200 of the present embodiment is configured such that not all of the side surfaces are covered with an electromagnetic wave shield but only a part thereof is covered.

As shown in FIGS. 4 and 5, the metal film 140 covers the top surface 131 of the insulating body 130, and a part of the side surface 132, and the metal film 140 also covers a part of the side surface 112 of the substrate 110. Specifically, one surface 132a of the side surface 132 of the insulating body 130 and one surface 112a of the substrate 110 are not covered with the metal film 140. That is, one side surface of the electronic component module 200 is not covered with the metal film 140.

Specifically, there is no recess portion formed on the side surface of the electronic component module 200 without a metal film 140, that is the recess portion 160 is formed around the periphery of the connection terminal formation surface 113 of the substrate 110, except for the edge on one of the side surfaces of the electronic component module 200.

Other configures of other parts such as the insulating body 130 or the substrate 110 are similar to that in the first embodiment, thus repeated descriptions will not shown in this embodiment.

In conclusion, while the first embodiment has described the case of forming the metal film 140 serving as an electromagnetic wave shield on two opposite side surfaces facing each other of the electronic component module 100 having a rectangle external appearance and forming the recess portion 160 in such side surfaces, it is possible to form the metal film 140 and the recess portion 160 on at least one side surface, for example three side surfaces as shown in the second embodiment.

Figure 7:
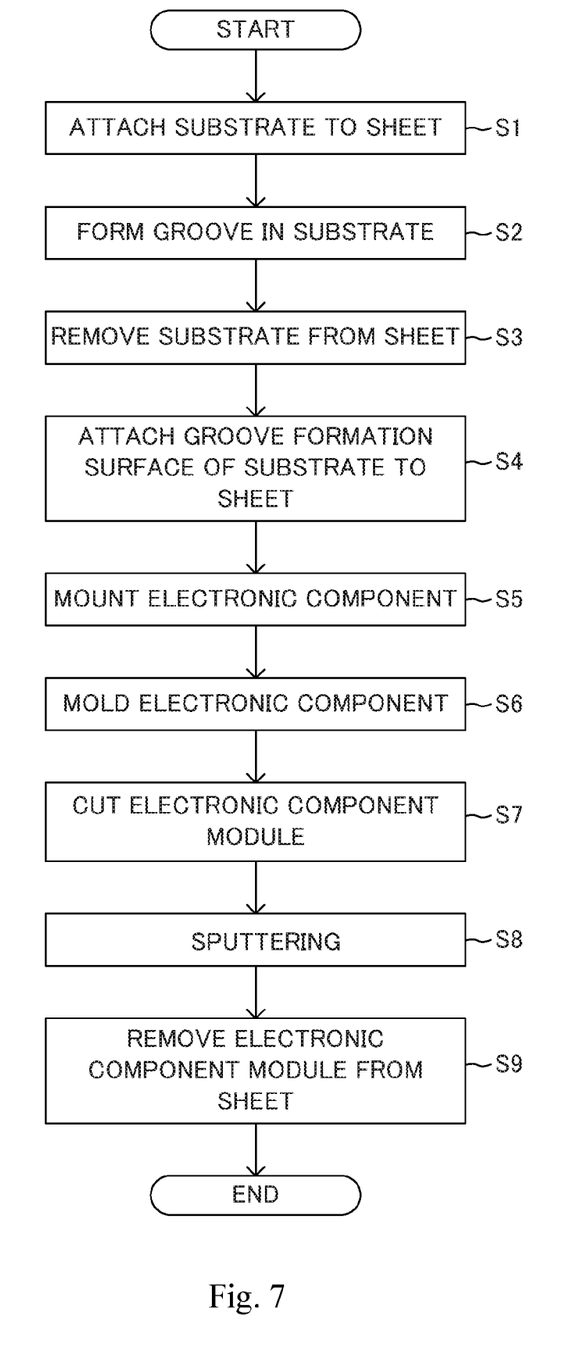
FIG. 7 is a simplified flowchart showing the operation of manufacturing electronic component modules according to the present embodiment.

The manufacturing method of an electronic component module according to the present invention will be described below, with reference to FIGS. 7 to 10. FIG. 7 is a simplified flowchart showing the operation of manufacturing electronic component modules according to the present embodiment. FIGS. 8a to 9c are illustrations showing states of respective steps of manufacturing the electronic component modules according to the present embodiment. FIG. 10 is a partial enlarged view of FIG. 9b, showing the configuration of an electronic component module according to the present invention.

Figure 8A:
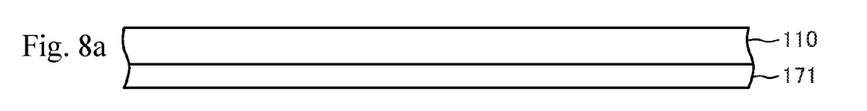

Specifically as shown in FIG. 8a, the substrate 110 on which a plurality of connecting terminal 150 (see FIG. 1) are formed is attached to a viscous first sheet 171 (step S1). At this step, an electronic component mounting surface of the substrate 110, which is the surface opposite to the connecting terminal formation surface on which the connecting terminals 150 are formed, is attached to the first sheet 171. Optionally, the substrate 110 is a printed board such as a glass epoxy board or an alumina board, for example. Further, the first sheet 171 may be a UV sheet, for example. However, any type of sheet may be used if it has viscosity for fixing the substrate 110.

Figure 8B:
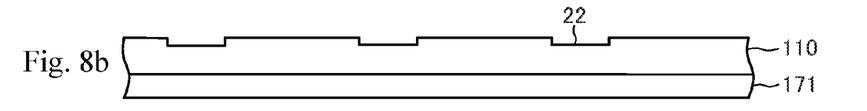

Then, as shown in FIG. 8b, grooves 22 having a predetermined depth are formed in a grid in the connecting terminal formation surface of the substrate 110 attached to the first sheet 171 (step S2). The grooves 22 are located at external portions of the connecting terminal formation surfaces of the electronic component modules 100, forming a stepped recess portion 160 inward with respect to the side surfaces of each of the electronic component modules 100, which will be described hereinafter; and the stepped recess portion 160 is formed on a periphery of the surface of the substrate 110 that is opposite to the electronic component mounting surface 111, as shown in FIGS. 1 and 2. Specifically, the recess portion 160 has a top surface 161 parallel to the electronic component mounting surface 111, and a side surface 162 abutting to and perpendicular to the top surface 161.

The grooves 22 are formed in such a manner that a resist is formed on the connecting terminal forming surface of the substrate 110, the resist is removed partially to form groove patters, and developing is applied, for example. Although the grooves 22 are formed by a solder resist process in the above description, the grooves 22 may be formed by means of cutting and processing with use of a blade, or by any other methods.

Figure 8C:
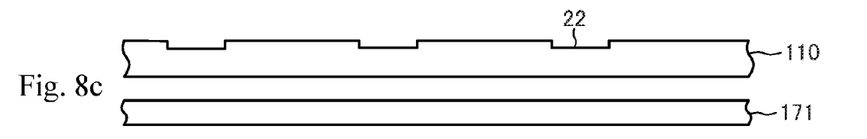
Figure 8D:
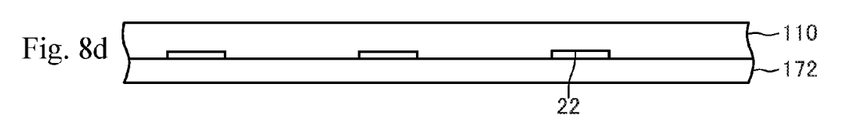

Then, as shown in FIG. 8c, the substrate 110 attached to the first sheet 171 is torn off to be removed from the first sheet 171 (step S3). Then, as shown in FIG. 8d, the connecting terminal formation surface of the substrate 110, that is, the groove formation surface where the grooves 22 are formed, is attached to a viscous second sheet 12 which is similar to the first sheet 171 (step S4). This means that the substrate 110 is turned over so that the groove formation surface becomes the lower side, and the second sheet 172 is attached to the groove formation surface. As the second sheet 172, the first sheet 171, just having been torn off, may be used.

Figure 8E:
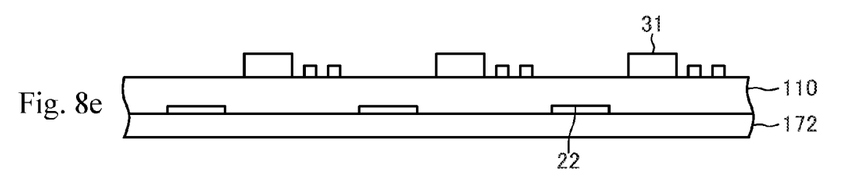

Then, as shown in FIG. 8e, electronic components 31 are mounted on the electronic component mounting surface which is a surface opposite to the groove formation surface of the substrate 110 (step S5). At this step, electronic components 31 are respectively mounted at positions corresponding to the respective electronic component modules so as to form a plurality of electric circuits. Thereby, a set of electronic component modules 100 are formed.

Figure 8F:
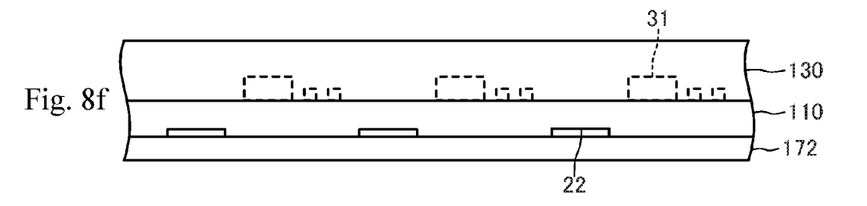

Then, as shown in FIG. 8f, transfer molding is applied to the electronic component mounting surface of the substrate 110 using insulating resin to form a mold section 130 in a flat plate shape (step S6). As a molding method, a resin insert molding may be used, for example. It should be noted that any material may be used as insulating resin if the material is an insulating body.

Figure 9A:
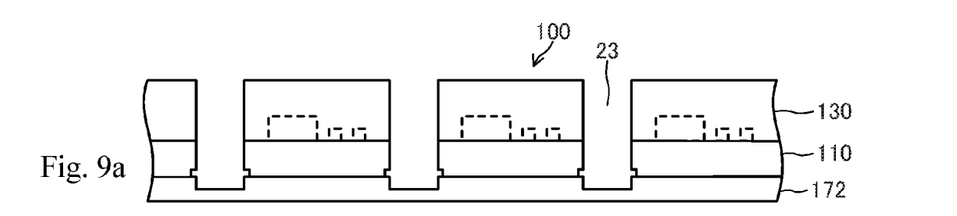
Figure 9B:
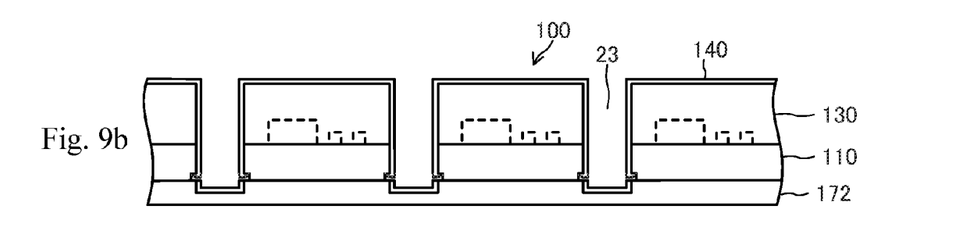
Figure 10:
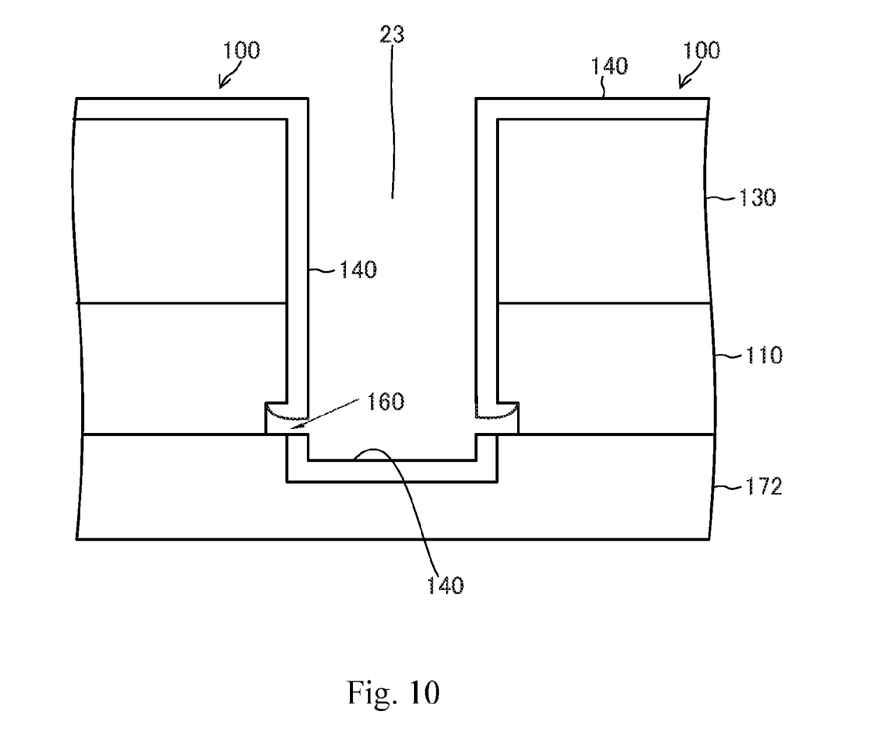
FIG. 10 is a partial enlarged view of FIG. 9b, showing the configuration of an electronic component module according to the present invention.

Then, as shown in FIG. 9a, the set of electronic component modules 100, on which the mold section 130 is formed, is cut into pieces by cutting the portions between the respective electronic component modules, from the top surface of the mold section 130 (step S7). At this step, the depth of the cut portion 23 is a depth for cutting the mold section 130 and the substrate 110 up to a position of a predetermined thickness so as to leave a part of the second sheet 172 uncut. As such, although the electronic component modules 100 are cut into pieces, the second sheet 172 is not cut off completely so that a part thereof in a thickness direction remains. Therefore, even after the electronic component modules 100 are cut into pieces, as they are attached to the second sheet 172 which is in the form of one sheet, they can be conveyed easily.

The width of the cut portion 23 is set according to the preset intervals between the respective electronic component modules 100. When cutting, the position of the grooves 22 in a grid, formed in the groove formation surface (connecting terminal formation surface) of the substrate 110 as described above, is cut with a blade having a width narrower than that of the cut portion 23. As the grooves 22 are formed to be wider than the width of the cut portion 23, in the groove formation surface of the substrate 110 constituting each of the electronic component modules 100, both end portions in a width direction of the grooves 22 are formed as stepped recess portion 160 (see FIG. 10).

Figure 9C:
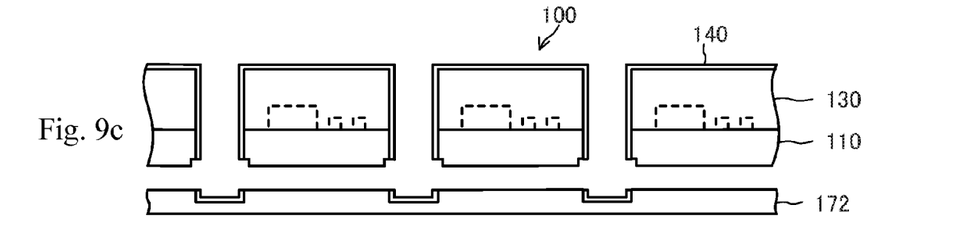

Then, as shown in FIG. 9b, the electronic component modules 100 attached to the second sheet 172 are immersed in sputtering solution to thereby form a conductive metal film 140 on the exposed surfaces of the respective pieces of electronic component modules 100 (step S8), that is, the external surfaces of the mold section 130, the side surfaces of the substrate 110, the top surface 161 of the recess portion 160. Please note that, the side surface 162 of the recess portion 160 is exposed without covered with the metal film 140. Thereby, an electromagnetic wave shield is formed by the metal film 140 on the entire external surfaces (except for the connecting terminal formation surface of the substrate 110 and the side surface 162 of the recess portion 160) of each of the electronic component modules 100, so that the magnetism leakage prevention effect and the magnetism shielding effect can be improved. As shown in FIG. 9c, the second sheet 172 is removed to obtain the individual electronic component module 100 (step S9).

The manufacturing method of the second embodiment mentioned above is not explained here, but can be produced basically by taking a manufacturing method of the first embodiment into account.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An electronic component module comprising:
   a substrate;
   at least one electronic component mounted on an electronic component mounting surface of the substrate;
   an insulating body that covers the electronic component on the electronic component mounting surface of the substrate; and
   a metal film formed by sputtering, the metal film covering at least one exterior surface of the insulating body and at least one side surface of the substrate;
   wherein the substrate has a recess portion formed on a periphery of a surface of the substrate that is opposite to the electronic component mounting surface, and the recess portion has a top surface parallel to the electronic component mounting surface and a side surface abutting to and perpendicular to the top surface, and the metal film is extended to cover the top surface of the recess portion, without covering the side surface of the recess portion.

2. The electronic component module according to claim 1, wherein the metal film covers all exterior surfaces of the insulating body and all side surfaces of the substrate.

3. The electronic component module according to claim 2, wherein the recess portion is formed around peripheries of the surface of the substrate that is opposite to the electronic component mounting surface.

4. The electronic component module according to claim 1, wherein the recess portion is formed in a stepped shape.

5. The electronic component module according to claim 4, wherein the recess portion formed in the stepped shape has a height in a thickness direction of the substrate that is in a range from 5 µm to 50 µm, and a depth that is 50 µm or more.

6. The electronic component module according to claim 1, wherein the surface of the substrate that is opposite to the electronic component mounting surface is not covered by the metal film.

7. The electronic component module according to claim 1, wherein the metal film is formed by sputtering.

8. The electronic component module according to claim 1, wherein the metal film comprises an underlayer, a copper layer and an oxidation resistant layer.

9. The electronic component module according to claim 1, wherein one or more stepped recess portions are formed on a periphery of the surface of the substrate that is opposite to the electronic component mounting surface.

10. A manufacturing method of an electronic component module comprising:
    mounting an electronic component on an electronic component mounting surface of a substrate;
    covering the electronic component with an insulating body on the electronic component mounting surface of the substrate;
    forming a recess portion on a periphery of a surface of the substrate that is opposite to the electronic component mounting surface, the recess portion having a top surface parallel to the electronic component mounting surface and a side surface abutting to and perpendicular to the top surface;
    in a state where the substrate is disposed on a predetermined sheet member, cutting into a piece of the electronic component module, or a set of electronic component modules, while remaining at least a part of the sheet member; and
    covering an exterior surface of the insulating body, a side surface of the substrate and the top surface of the recess portion with a metal film by sputtering, with the side surface of the recess portion being exposed.

11. The manufacturing method according to claim 10, wherein the covering with the metal film comprises covering all exterior surfaces of the insulating body and all side surfaces of the substrate with the metal film.

12. The manufacturing method according to claim 11, further comprising forming the recess portion around peripheries of the surface of the substrate that is opposite to the electronic component mounting surface.

13. The manufacturing method according to claim 10, wherein the recess portion is formed in a stepped shape.

14. The manufacturing method according to claim 13, wherein the recess portion formed in the stepped shape has a height in a thickness direction of the substrate that is in a range from 5 µm to 50 µm, and a depth that is 50 µm or more.

* * * * *